United States Patent
Wagner (10) Patent No.: US 12,112,968 B2
(45) Date of Patent: Oct. 8, 2024

(54) METHOD FOR PRODUCING OPTOELECTRONIC DEVICES

(71) Applicant: OSRAM Opto Semiconductors GmbH, Regensburg (DE)

(72) Inventor: Ralph Wagner, Neutraubling (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 298 days.

(21) Appl. No.: 17/288,430

(22) PCT Filed: Oct. 25, 2019

(86) PCT No.: PCT/EP2019/079242
§ 371 (c)(1),
(2) Date: Apr. 23, 2021

(87) PCT Pub. No.: WO2020/089101
PCT Pub. Date: May 7, 2020

(65) Prior Publication Data
US 2021/0358792 A1    Nov. 18, 2021

(30) Foreign Application Priority Data
Oct. 29, 2018   (DE) .......................... 102018126936.6

(51) Int. Cl.
*B32B 43/00*   (2006.01)
*H01L 21/683*   (2006.01)
(Continued)

(52) U.S. Cl.
CPC ........ *H01L 21/6835* (2013.01); *B32B 43/006* (2013.01); *H01L 33/0093* (2020.05);
(Continued)

(58) Field of Classification Search
CPC ............. B32B 43/006; Y10T 156/1158; Y10T 156/1917
See application file for complete search history.

(56) References Cited

U.S. PATENT DOCUMENTS

| 8,012,856 B2 | 9/2011 | von Malm |
| 8,592,840 B2 | 11/2013 | Peter et al. |

(Continued)

FOREIGN PATENT DOCUMENTS

| DE | 102009056386 A1 | 6/2011 |
| DE | 102009060749 A1 | 7/2011 |

(Continued)

*Primary Examiner* — Philip C Tucker
*Assistant Examiner* — Nickolas R Harm
(74) *Attorney, Agent, or Firm* — Slater Matsil, LLP (57) ABSTRACT

In an embodiment a method includes providing a growth substrate with a plurality of semiconductor bodies for the semiconductor devices, wherein each semiconductor body comprises electrical contact structures and a separation layer arranged towards the growth substrate, arranging a rigid first auxiliary carrier on a side of the semiconductor bodies facing away from the growth substrate, wherein the first auxiliary carrier comprises a first detachment layer, detaching the growth substrate by laser radiation, wherein the laser radiation is absorbed in the separation layer, arranging a rigid second auxiliary carrier on a side of the semiconductor bodies facing away from the first auxiliary carrier, wherein the second auxiliary carrier comprise a second detachment layer, detaching the first auxiliary carrier by laser radiation, wherein the laser radiation is absorbed in the first detachment layer and the separation layer still extending continuously over the growth substrate while detaching and mechanically and electrically arranging the semiconductor bodies on at least one permanent carrier.

20 Claims, 7 Drawing Sheets

(51) Int. Cl.
  *H01L 33/00*     (2010.01)
  *H01L 33/22*     (2010.01)
  *H01L 33/32*     (2010.01)
(52) U.S. Cl.
  CPC .............. *H01L 33/22* (2013.01); *H01L 33/32* (2013.01); *H01L 2221/68354* (2013.01); *H01L 2221/68368* (2013.01); *Y10T 156/1158* (2015.01); *Y10T 156/1917* (2015.01)

(56) References Cited

U.S. PATENT DOCUMENTS

| | | |
|---|---|---|
| 8,877,530 B2 | 11/2014 | Seong |
| 8,932,888 B2 | 1/2015 | Wagner |
| 9,831,379 B2 | 11/2017 | Yoneda et al. |
| 9,893,041 B2 | 2/2018 | Pokhriyal et al. |
| 10,424,501 B2 | 9/2019 | Hirao |
| 10,741,718 B2 | 8/2020 | Zou et al. |
| 10,755,958 B2 | 8/2020 | Arai |
| 11,081,620 B2 | 8/2021 | Plössl et al. |
| 2003/0162463 A1 | 8/2003 | Hayashi et al. |
| 2015/0179877 A1 | 6/2015 | Hu et al. |
| 2016/0268491 A1 | 9/2016 | Wu et al. |
| 2020/0091372 A1 | 3/2020 | Plössl et al. |

FOREIGN PATENT DOCUMENTS

| | | |
|---|---|---|
| DE | 102012101393 A1 | 8/2013 |
| DE | 102016124646 A1 | 6/2018 |
| JP | 2006140398 A | 6/2006 |
| JP | 2011522436 A | 7/2011 |
| JP | 2013211443 A | 10/2013 |
| JP | 2014103288 A | 6/2014 |
| JP | 2016506061 A | 2/2016 |
| JP | 2016051731 A | 4/2016 |
| JP | 2018060993 A | 4/2018 |
| WO | 2016158264 A1 | 10/2016 |
| WO | 2017180693 A1 | 10/2017 |
| WO | 2018109193 A1 | 6/2018 |

METHOD FOR PRODUCING OPTOELECTRONIC DEVICES

This patent application is a national phase filing under section 371 of PCT/EP2019/079242 filed Oct. 25, 2019, which claims the priority of German patent application 102018126936.6, filed Oct. 29, 2018, each of which is incorporated herein by reference in its entirety.

TECHNICAL FIELD

A method for producing optoelectronic semiconductor devices is specified.

SUMMARY

Embodiments provide a method for producing optoelectronic semiconductor devices by which small semiconductor chips can be efficiently transferred from a growth substrate to a carrier.

In particular, the method described herein is a parallel or very fast serial transfer of semiconductor chips by means of a laser lift-off process without film processes and without mechanically flexible auxiliary carriers for small LED chips.

According to at least one embodiment, the method is for producing one or a plurality of optoelectronic semiconductor devices. The semiconductor devices are, for example, light-emitting diodes, or LEDs for short, luminaires, headlights, or displays. In particular, the semiconductor devices include a plurality of transferred semiconductor chips. It is possible that different types of semiconductor chips are incorporated within a semiconductor device during the course of the method.

According to at least one embodiment, the method includes the step of providing a growth substrate. A plurality of semiconductor bodies for the semiconductor devices are provided on the growth substrate, for example a sapphire substrate. The semiconductor bodies are preferably structured out of a continuously grown, connected semiconductor layer sequence. For example, separation trenches are provided between adjacent semiconductor bodies, which preferably only partially penetrate the semiconductor layer sequence. The separation trenches are created, for example, by means of etching and preferably extend through an active zone for generating radiation.

The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or an arsenide compound semiconductor material such as $Al_nIn_{1-n-m}Ga_mAs$ or such as $Al_nGa_mIn_{1-n-m}As_kP_{1-k}$, wherein in each case $0 \leq n \leq 1$, $0 \leq m \leq 1$ and $n+m \leq 1$ as well as $0 \leq k < 1$. Preferably, for at least one layer or for all layers of the semiconductor layer sequence, $0 < n \leq 0.8$, $0.4 \leq m < 1$ and $n+m \leq 0.95$ as well as $0 < k \leq 0.5$. In this context, the semiconductor layer sequence may comprise dopants as well as additional components. For simplicity, however, only the essential constituents of the crystal lattice of the semiconductor layer sequence, i.e., Al, As, Ga, In, N or P, are specified, even if these may be partially replaced and/or supplemented by small amounts of additional substances.

According to at least one embodiment, the semiconductor bodies are each provided with electrical contact structures. That is, while still on the growth substrate, the semiconductor bodies can in principle be electrically contacted. Thereby, it is not necessary that the semiconductor bodies are separately manageable, individual electrical units.

According to at least one embodiment, the semiconductor bodies comprise a separation layer towards the growth substrate. Preferably, the separation layer is a part of the semiconductor layer sequence from which the semiconductor bodies are structured. Particularly preferably, the separation layer extends continuously across all semiconductor bodies. That is, the separation layer is then not affected by the separation trenches. The separation layer is, for example, a GaN layer, in particular an undoped GaN layer. Parts of the semiconductor layer sequence adjacent to the separation layer are, for example, n-doped.

According to at least one embodiment, the method comprises the step of arranging a rigid first auxiliary carrier to a side of the semiconductor bodies facing away from the growth substrate. In particular, the first auxiliary carrier is attached to the electrical contact structures. The first auxiliary carrier comprises a first detachment layer.

According to at least one embodiment, the method comprises the step of detaching the growth substrate from the semiconductor bodies by means of laser radiation. The laser radiation is absorbed in the separation layer. As a result, the separation layer is decomposed. Due to the destruction of the separation layer by the laser radiation, a mechanical connection between the semiconductor bodies and the growth substrate is mainly or completely lost. The growth substrate itself and other layers of the semiconductor layer sequence, with the exception of the separation layer, are preferably not or not significantly affected by the laser lift-off process by means of the laser radiation.

After the detachment from the growth substrate, the semiconductor bodies together with the respective contact structures can already be regarded as semiconductor chips. These semiconductor chips are preferably functional in principle and/or suitable for light generation.

According to at least one embodiment, the method comprises the step of arranging a rigid second auxiliary carrier to a side of the semiconductor bodies facing away from the first auxiliary carrier. That is, the second auxiliary carrier is attached where the separation layer and the growth substrate were previously located. The second auxiliary carrier is provided with a second detachment layer.

According to at least one embodiment, the method comprises the step of detaching the first auxiliary carrier by means of laser radiation. The laser radiation is absorbed in the first detachment layer. In other words, a laser detachment process is performed from the first auxiliary carrier using the first detachment layer in a similar manner as from the growth substrate using the separation layer.

According to at least one embodiment, a mechanical and electrical arranging of the semiconductor bodies is performed on at least one permanent carrier. The permanent carrier is, for example, a printed circuit board and/or a drive chip for driving the semiconductor bodies. Depending on whether further auxiliary carriers are used, the detachment of the semiconductor bodies from the second auxiliary carrier is carried out before or with the arranging on the permanent carrier. The second auxiliary carrier is detached by laser radiation using the second detachment layer in the same manner as the first auxiliary carrier is detached using the first detachment layer.

In at least one embodiment, the method for producing optoelectronic semiconductor devices comprises the following steps, preferably in the order indicated:

Providing a growth substrate with a plurality of semiconductor bodies for the semiconductor devices, wherein the semiconductor bodies are each provided with electrical contact structures and comprise a separation layer towards the growth substrate, arranging a rigid first auxiliary carrier to a side of the semiconductor bodies facing away from the growth substrate, wherein the first auxiliary carrier is provided with a first detachment layer, detaching the growth substrate by means of laser radiation, wherein the laser radiation is absorbed in the separation layer, arranging a rigid second auxiliary carrier to a side of the semiconductor bodies facing away from the first auxiliary carrier, wherein the second auxiliary carrier is provided with a second detachment layer, detaching the first auxiliary carrier by means of laser radiation, wherein the laser radiation is absorbed in the first detachment layer, and mechanically and electrically attaching the semiconductor bodies to at least one permanent carrier.

The method described herein can be used to handle small semiconductor chips, in particular LED chips. The term small semiconductor chips refer in particular to semiconductor chips with lateral dimensions of at most 130 µm or of at most 500 µm. Such small semiconductor chips generally cannot be removed with reasonable effort using removal processes based on foils and foil carriers. For example, bending radii of foils typically used are downward limited by the foil thickness and thus also the detachment of a foil from small semiconductor chips. For smaller bending radii, the foil would have to be thinner, which is not possible due to the wafer sizes used and the necessary expansion and stretching of the foil. The foils would then no longer comprise sufficient strength.

In particular for semiconductor chips that are also very thin at the same time and do not have a bonded carrier, a pick-and-place method with cutting out of a foil is also not practicable because the semiconductor chips do not comprise sufficient mechanical strength. Such thin semiconductor chips comprise, for example, a thickness of the semiconductor layer sequence below 12 µm or 8 µm and only a stabilizing substructure, for example applied by electroplating, with a thickness of at least 5 µm and/or at most 60 µm.

Thus, the elimination of foils in the transfer process and in the detachment process represents a significant simplification. In the case of small semiconductor chips, a parallel transfer of a large number of the semiconductor chips also represents a significant time saving and also reduces problems with regard to a deposition accuracy of the semiconductor chips.

In the method described here, the semiconductor chips can remain in the original chip grid as present on the growth substrate. Furthermore, the consistent use of hard, rigid carriers instead of flexible foils is possible. Laser lift-off processes, also known as laser lift-off or LLO for short, can be used, especially in combination with detachment layers that absorb the laser radiation and with cleanable adhesives. A transfer of semiconductor chips with the aid of laser radiation, in particular with the aid of so-called Laser Induced Forward Transfer or also with the aid of stamps or pick-and-place tools is possible, especially with a selective release of selected semiconductor chips.

According to at least one embodiment, the semiconductor bodies comprise an average edge length of at least 5 µm or 10 µm or 20 µm or 40 µm when viewed in a plan view of the growth substrate. Alternatively or additionally, the average edge length is at most 500 µm or 200 µm or 130 µm or 100 µm.

According to at least one embodiment, the semiconductor bodies or the semiconductor bodies fully detached from the growth substrate are flip chips. That is, all electrical contact structures for external electrical contacting of the semiconductor body concerned are preferably located on a side of the semiconductor bodies facing away from the growth substrate. Alternatively, it is possible that the semiconductor bodies are configured for electrical contacting on both opposite main sides of the semiconductor bodies.

According to at least one embodiment, the separation layer for detaching the growth substrate extends continuously over the growth substrate and across the semiconductor bodies. For example, the separation layer is a layer epitaxially grown on the growth substrate, in particular of gallium nitride, with a thickness of at least 50 nm or 100 nm. Alternatively or additionally, the separation layer comprises a maximum thickness of at most 0.5 µm or of at most 1 µm.

According to at least one embodiment, the auxiliary carriers are attached to the semiconductor bodies by means of bonding agent layers. The bonding agent layers are preferably reversibly removable adhesives. The bonding agent layers can be removed, for example, with the aid of solvents or by increasing the temperature, wherein the semiconductor bodies and the electrical contact structures are not affected. The semiconductor bodies may be partially or fully embedded in the respective bonding agent layer or may rest on the bonding agent layer.

According to at least one embodiment, the bonding agent layers are different from the corresponding detachment layers. In particular, the laser radiation used for detachment does not reach the bonding agent layers or does not reach them to a significant extent.

According to at least one embodiment, the bonding agent layers are predominantly or, preferably, completely removed after removal of the corresponding auxiliary carrier. That is, the bonding agent layers for the auxiliary carriers are no longer present in the finished semiconductor devices.

According to at least one embodiment, at least one metallization for the contact structures extends over all semiconductor bodies when the growth substrate is detached. That is, the metallization and/or the contact structures also bridge regions between the semiconductor bodies. In particular in regions between the semiconductor bodies, the at least one metallization can thus run congruently with the separation layer.

According to at least one embodiment, the at least one metallization in the regions between the semiconductor bodies is divided in a separate separation step after removal of the growth substrate. This separation step is preferably also a laser separation, for example by means of picosecond laser pulses. It is possible that further components on the growth substrate are also cut during the cutting of the at least one metallization, or that this cutting step is limited to the at least one metallization.

According to at least one embodiment, regions between the semiconductor bodies are free of metallization for the contact structures when the growth substrate is detached. In particular, in these regions between the semiconductor bodies, the separation layer is exposed or the separation layer is covered only by a protective layer or by a passivation layer. Such a protective layer or passivation layer comprises, for example, a thickness of at most 500 nm. In contrast, the metallization preferably comprises a thickness of at least 1 µm. Furthermore, such protective layers or passivations are preferably made of dielectric materials, in contrast to the metallization. Such protective layers or passivations may be of organic or inorganic materials.

According to at least one embodiment, the semiconductor bodies are designed as light emitting diode chips. That is, the semiconductor bodies comprise one or more active zones for generating radiation during intended operation of the finished semiconductor devices. Preferably, the semiconductor bodies are made of the material system AlInGaN or AlInGaP and are configured for generating blue light or red light.

According to at least one embodiment, a roughening is produced on the semiconductor bodies after the growth substrate has been detached in order to improve light extraction. The roughening is produced in particular in regions of the semiconductor body to which the second auxiliary carrier is subsequently attached. In particular, the roughening is opposite the first and/or a third auxiliary carrier. During the generation of the roughening, the first auxiliary carrier is preferably attached to the semiconductor bodies.

According to at least one embodiment, the detaching of the second auxiliary carrier is performed by means of laser radiation. The laser radiation is absorbed in the second detachment layer. The absorption of the laser radiation causes the second detachment layer to decompose, analogously to the separation layer.

According to at least one embodiment, the semiconductor bodies are transferred directly from the second auxiliary carrier to the permanent carrier. In this process, the semiconductor bodies are preferably not simultaneously on both carriers. That is, as long as the semiconductor bodies are attached to the second auxiliary carrier, the semiconductor bodies are not yet attached to the permanent carrier. The transfer to the carrier thus preferably takes place by means of a detachment from the second auxiliary carrier.

According to at least one embodiment, a rigid third auxiliary carrier is attached after the first auxiliary carrier has been detached. The third auxiliary carrier is located in particular at the contact structures. The third auxiliary carrier is preferably attached while the second auxiliary carrier is still on the semiconductor bodies.

The second auxiliary carrier can be located at the roughening. Alternatively, the roughening is formed after the first or also the second auxiliary carrier has been removed, when the semiconductor bodies are located on the third auxiliary carrier.

According to at least one embodiment, a plurality of the semiconductor bodies are transferred from the second auxiliary carrier or from the third auxiliary carrier to the permanent carrier. This is carried out, for example, by means of a laser beam and/or by means of a stamping process. Preferably, mounting surfaces and/or electrical contacting surfaces are provided on the permanent carrier, on which the semiconductor bodies with the associated contact structures are placed. In the case of a stamping process, this plurality of semiconductor bodies can be transferred simultaneously. In case of using laser radiation, one semiconductor body at a time or only a few semiconductor bodies at a time are transferred from the auxiliary carrier to the permanent carrier.

According to at least one embodiment, the contact structures and/or the semiconductor bodies are embedded in a filler material before attaching to the permanent carrier. The generation of the filler material can take place while the semiconductor bodies are still on the growth substrate, on the first carrier, on the second carrier or also on the third auxiliary carrier.

According to at least one embodiment, the filler material is cut in regions between the semiconductor bodies after detaching of the growth substrate. In this case, the filler material is generated in particular while the growth substrate is still on the semiconductor bodies and thus before the first auxiliary carrier is attached.

When cutting the filler material in regions between adjacent semiconductor bodies, laser radiation may be applied, for example picosecond laser radiation. It is possible that the filler material is cut in the same cutting step as the at least one metallization in the regions between adjacent semiconductor bodies. The filler material is in particular a plastic.

According to at least one embodiment, the laser radiation for detaching the semiconductor bodies from the growth substrate and/or from at least one of the auxiliary carriers is scanned over the growth substrate and/or over the respective auxiliary carrier. This scanning can be done with a galvanic mirror, with a polygon scanner or also with several laser regions moving simultaneously over the growth substrate and/or the respective auxiliary carrier.

This enables individual semiconductor bodies or groups of semiconductor bodies to be detached from the growth substrate and/or the respective auxiliary carrier. In this way, for example, a pitch of the semiconductor bodies can be maintained during the transfer of the semiconductor bodies from the growth substrate to the subsequent auxiliary carrier, during the transfer from a prior auxiliary carrier to a subsequent auxiliary carrier, or during the transfer from one of the auxiliary carriers to the permanent carrier.

However, the pitch may also be increased during the respective transfer, in particular by an n-fold, wherein n is an integer greater than or equal to 2 and preferably less than or equal to 10. Furthermore, it is possible to transfer only semiconductor bodies that have been tested for their function and thereby found to be functional. Thus semiconductor devices with a multiplicity of semiconductor bodies can be produced, wherein the semiconductor bodies in the semiconductor device exhibit only a small error rate.

According to at least one embodiment, the semiconductor bodies grown on the growth substrate are distributed to a plurality of different permanent carriers. Further, it is possible that multiple growth substrates are used per permanent carrier to place semiconductor bodies on the respective permanent carrier. The semiconductor bodies to be placed on the permanent carrier may be of the same design or may be designed differently from each other, for example, to produce different colors. For example, red-green-blue pixels, in short RGB pixels, may be formed on the carrier.

According to at least one embodiment, a plurality of the semiconductor bodies are arranged on each carrier. An average distance between adjacent semiconductor bodies on the respective carrier is preferably small. For example, this average distance is at most 0.2 mm or 50 µm or 20 µm or 10 µm.

According to at least one embodiment, testing of the semiconductor bodies is performed prior to attaching the semiconductor bodies to the at least one permanent carrier and/or to one of the auxiliary carriers. This testing is preferably performed after the first auxiliary carrier has been detached. That is, during testing, the semiconductor bodies are preferably located on the second auxiliary carrier or on the third auxiliary carrier.

Alternatively or additionally, it is possible that material-removing processing of the contact structures takes place in particular after the first auxiliary carrier has been detached. That is, the contact structures can be planarized and/or grounded, for example. This material-removing processing is preferably carried out as long as the semiconductor bodies are located on the second auxiliary carrier or on the third auxiliary carrier. In addition to or instead of material-removing processing, coatings can also be applied, for example for better solder contacting of the contact structures or as protective layers.

According to at least one embodiment, the separation layer and/or the detachment layers or at least one detachment layer are made of a nitride such as silicon nitride or gallium nitride and/or of an oxide, in particular a metal oxide such as zinc oxide. Thus, separation layers and detachment layers absorbing in the near ultraviolet spectral range can be obtained.

According to at least one embodiment, the auxiliary carriers or at least one of the auxiliary is carriers made of sapphire, quartz glass or a glass. Preferably, the auxiliary carriers and the growth substrate are configured that the laser radiation for releasing the growth substrate or the respective auxiliary carrier is irradiated through the growth substrate or through the respective auxiliary carrier. That is, the growth substrate and/or the auxiliary carriers are transmissive to the laser radiation used for detaching and are not significantly absorbent.

According to at least one embodiment, during structuring of the semiconductor bodies, the semiconductor layer sequence is removed up to the separation layer, wherein the active zone is interrupted. That is, during structuring, the separation layer may be exposed.

According to at least one embodiment, the separation layer is still partially present in the finished semiconductor devices. That is, the separation layer is thus only partially removed. In this case, it is possible that the separation layer protrudes laterally beyond the semiconductor bodies in the finished semiconductor devices.

According to at least one embodiment, the metallization forms a mirror on the side surfaces of the semiconductor bodies. In particular, due to the mirror in the finished semiconductor devices, radiation emission from the semiconductor bodies at the side surfaces may be prevented.

According to at least one embodiment, the metallization in the finished semiconductor devices is laterally flush with the separation layer. Thus, the separation layer does not project beyond the metallization.

BRIEF DESCRIPTION OF THE DRAWINGS

In the following, a production method described here is explained in more detail with reference to the drawings using exemplary embodiments. Identical reference signs specify identical elements in the individual figures. However, no references are shown to scale; rather, individual elements may be shown exaggeratedly large for better understanding.

DETAILED DESCRIPTION OF ILLUSTRATIVE EMBODIMENTS

Figure 1:
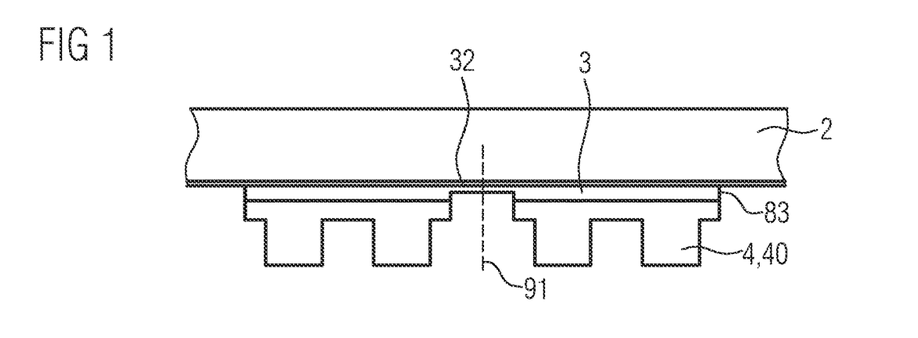
FIGS. 1 to 10 show schematic sectional views of method steps of an exemplary embodiment of a manufacturing method described herein.

FIGS. 1 to 10 illustrate an exemplary embodiment of a method described herein. Referring to FIG. 1, a growth substrate 2 is provided. The growth substrate 2 is in particular a sapphire substrate.

A semiconductor layer sequence, which is structured to form semiconductor bodies 3, is located on the growth substrate 2. The semiconductor layer sequence is preferably based on AlInGaN. A separation layer 32 extends continuously across all semiconductor bodies 3. The separation layer 32 may be located directly or close to the growth substrate 2. For example, the separation layer 32 is an undoped GaN layer.

The semiconductor bodies 3 are formed by structuring a semiconductor layer sequence, wherein the semiconductor layer sequence has been previously formed preferably continuously on the growth substrate 2. These steps take place before the manufacturing state shown in FIG. 1. The semiconductor layer sequence thereby preferably comprises the semiconductor bodies 3, which are produced by the structuring, as well as the separation layer 32. In addition, the semiconductor layer sequence comprises an active zone, not drawn, in which radiation to be emitted is generated during operation, in particular by means of electroluminescence. The active zone is preferably arranged at a distance from the separation layer 32.

A singulation lane 91 is located between adjacent semiconductor bodies 3. In the region of the singulation lane 91, the material of the semiconductor layer sequence from which the semiconductor bodies 3 are made has been removed, for example by means of etching.

The singulation lanes 91 preferably penetrate the active zone which is not drawn, so that individual regions of the active zone are each restricted to the individual semiconductor bodies 3 by the singulation lanes 91. That is, the active zone is located between the separation layer 32 and the metallization 40, penetrated by the singulation lanes 91. Deviating from the illustration in FIG. 1, it is alternatively also possible that the separation layer 32 is exposed by the singulation lanes 91, as is also possible in all other exemplary embodiments.

Side surfaces of the individual semiconductor bodies 3 as well as a side of the separation layer 32 facing away from the growth substrate 2 are preferably covered by a passivation 83. The passivation 83 is, for example, an oxide layer such as a silicon dioxide layer. A thickness of the passivation 83 is, for example, at least 40 nm and/or at most 300 nm.

On the side of each semiconductor bodies 3 facing away from the growth substrate 2, at least one metallization 40 for electrical contact structures 4 is arranged. The semiconductor bodies 3 can be electrically connected via the contact structures 4. The contact structures 4, which are in each case only illustrated in a highly simplified manner in the figures, preferably include both an anode contact and a cathode contact. Thus, the semiconductor bodies 3 together with the contact structures 4 may be designed as flip chips.

An internal structure of the contact structures 4 as well as of the metallization 40 is not illustrated in the figures in each case. In particular, possibly existing through-connections through an active zone of the semiconductor bodies 3 as well as electrically insulating layers between the anode contacts and the cathode contacts of the contact structure 4 are not shown. Furthermore, it is not drawn that the metallization 40 as well as the contact structures 4 are preferably formed by several successive metal layers. The contact structures 4 are for example formed by vapor deposition in combination with electroplating.

The contact structures 4 are, for example, electroplating layers structured by photographic technology. It is possible that the contact structures 4 are only thinly formed and are formed, for example, by thin solderable metallizations on the semiconductor bodies 3. In this case, the contact structures 4 comprise, for example, a thickness of at most 2 µm. As an alternative to metals, the contact structures 4 may also comprise electrically conductive oxides such as ITO or be formed therefrom.

Lateral dimensions of the semiconductor bodies 3 are, for example, between 30 µm and 130 µm inclusive. A thickness of the semiconductor bodies 3 together with the associated contact structures 4 is, for example, at least 30 µm and/or at most 70 µm. That is, the semiconductor bodies 3 together with the contact structures 4 are comparatively thin. A thickness of the separation layer 32 is preferably at least 100 nm. A width of the singulation lanes 91 between the semiconductor bodies 3 is preferably at least 0.5 µm or 1 µm or 5 µm and/or at most 70 µm or 50 µm or 20 µm. These values may also apply individually or in combination in all other exemplary embodiments.

Figure 2:
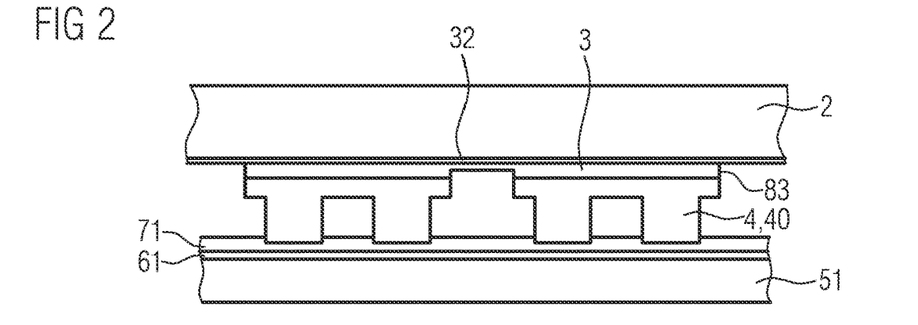

In the method step of FIG. 2, it is illustrated that a temporary, mechanically rigid first auxiliary carrier 51 is attached to the contact structures 4. A first detachment layer 61 is provided on the first auxiliary carrier 51. The detachment layer 61 is configured to absorb laser radiation. The detachment layer 61 is, for example, made of ZnO or SiN. The same can apply to all other detachment layers 62, 63.

A first bonding agent layer 71 is located on the first detachment layer 61. The bonding agent layer 71 is formed by an adhesive. By means of the first bonding agent layer 71, the first auxiliary carrier 51 adheres to the semiconductor bodies 3 and thus indirectly to the growth substrate 2. It is possible that the contact structures 4 are partially pressed into the first bonding agent layer 71.

Figure 3:
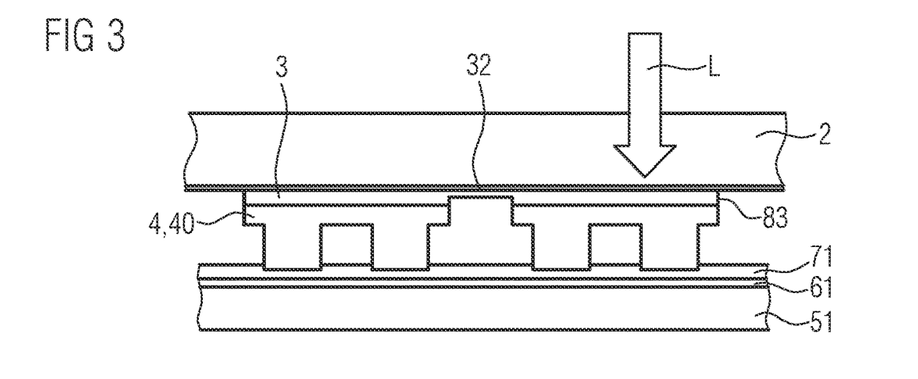

In the step of FIG. 3, it is illustrated that a laser radiation L is irradiated through the growth substrate 2 onto the separation layer 32 and is absorbed therein. As a result, the separation layer 32 is at least partially decomposed and the growth substrate 2 can be detached. After the semiconductor bodies 3 have been detached, the growth substrate 2 can be cleaned and reused.

Figure 4:
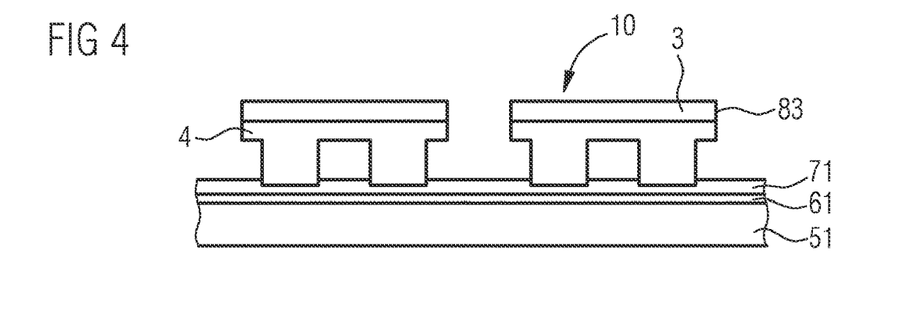

The semiconductor bodies 3 attached only to the first auxiliary carrier 51 can be seen in FIG. 4. Semiconductor chips 10 are thus formed on the first auxiliary carrier 51 by the semiconductor bodies 3 with the associated contact structures 4.

The first auxiliary carrier 51 is, for example, a rigid substrate of sapphire, glass or quartz glass, as in all other exemplary embodiments. Preferably, the first auxiliary carrier 51 is transparent to near ultraviolet radiation, for example laser radiation L around 355 nm. The same can apply to all other auxiliary carriers 52, 53.

Figure 5:
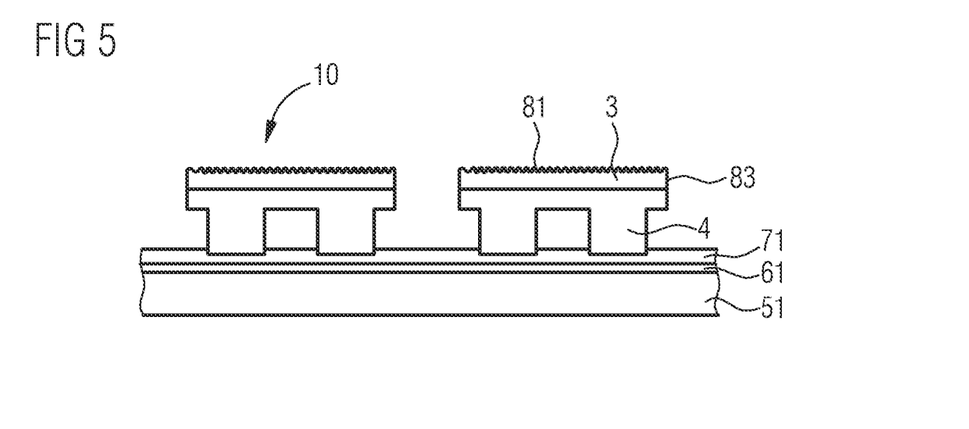

In the optional method step of FIG. 5, it is shown that a roughening 81 is produced on the semiconductor bodies 3. This is done, for example, by KOH etching. The contact structures 4, the passivation 83 and the components 51, 61, 71 preferably remain unaffected by the generation of the roughening.

Figure 6:
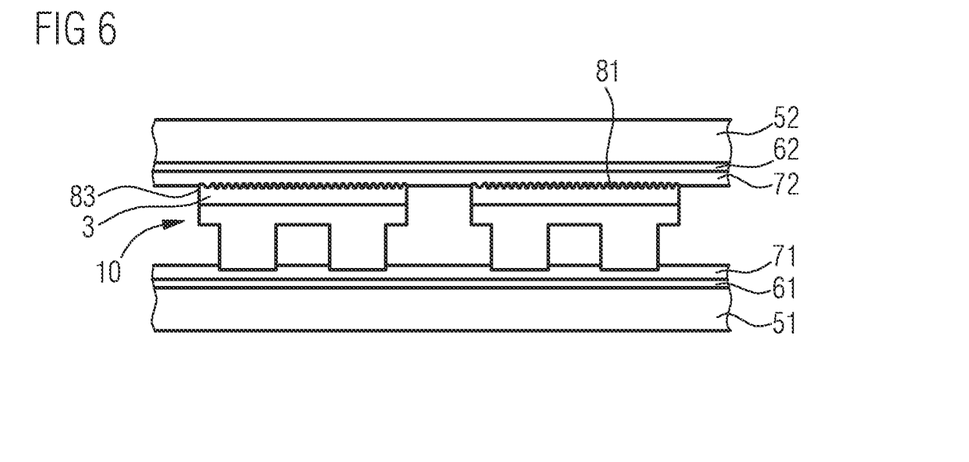

In the method step of FIG. 6, it is shown that a temporary second auxiliary carrier 52 is applied in particular to the roughening 83. Like the first auxiliary carrier 51, the second auxiliary carrier 52 is mechanically rigid and can be formed from the same materials as the first auxiliary carrier 51. Also on the second auxiliary carrier 52 there is a second detachment layer 62, followed by a second bonding agent layer 72.

Figure 7:
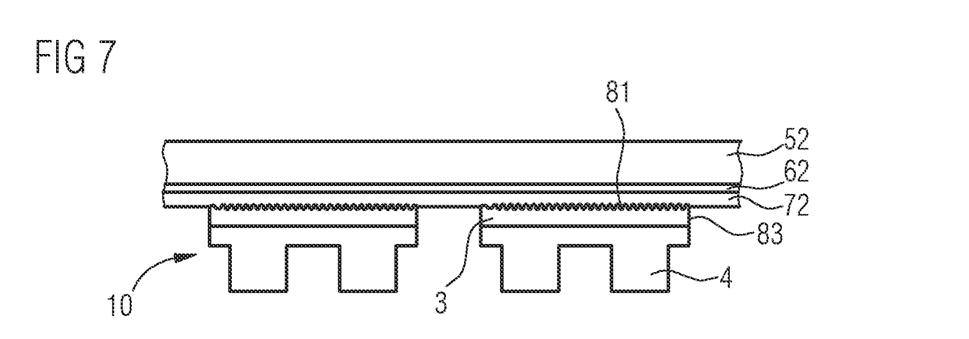

In the method step shown in FIG. 7, the first auxiliary carrier 51 is detached together with the first detachment layer 61 and the first bonding agent layer 71. The detachment of the first auxiliary carrier 61 is preferably carried out by means of laser radiation which is irradiated through the first auxiliary carrier 51 onto the first detachment layer 61 and is absorbed therein, whereby the first detachment layer 61 is decomposed. This detaching step is analogous to the step of FIG. 3.

After the removal of the auxiliary carrier 51 by means of decomposition of the detachment layer 61, residues of the detachment layer 61 and the bonding agent layer 71 are preferably removed, for example by means of a solvent or by increasing the temperature. In this process, the second bonding agent layer 72 preferably remains intact or at least functional. In particular, it is possible to select the chemical properties of the bonding agents 71, 72 such that the bonding agents 71, 72 can be removed independently of each other.

Figure 8:
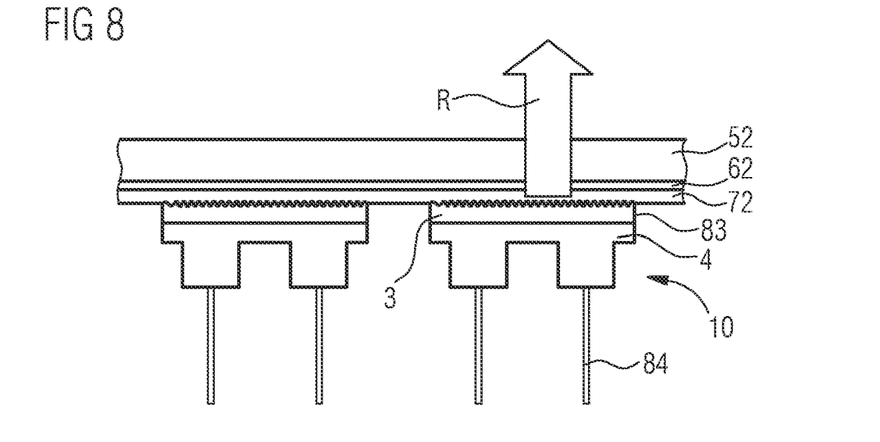

FIG. 8 shows a further optional method step. Here, the contact structures 4 can be ground, polished and/or coated in order to achieve more efficient electrical contacting. Furthermore, it is possible to apply additional passivation layers or protective layers to the contact structures 4, to the semiconductor bodies 3 and/or to the passivation 83.

Furthermore, it is illustrated in FIG. 8 that optionally a testing of the semiconductor bodies 3 can be performed. Contact needles 84 can be attached to the contact structures 4 for this purpose. As an alternative to needles 84, matrix contacts may also be used. The semiconductor bodies 3 together with the contact structures 4 thus form already functioning semiconductor chips 10, in particular LED chips.

Radiation R generated by the semiconductor bodies 3 can be detected, for example, through the second auxiliary carrier 52. In order to enable measurement of generated radiation R, the components 52, 62, 72 are preferably transmissive or at least partially transmissive for the generated radiation R.

Figure 9:
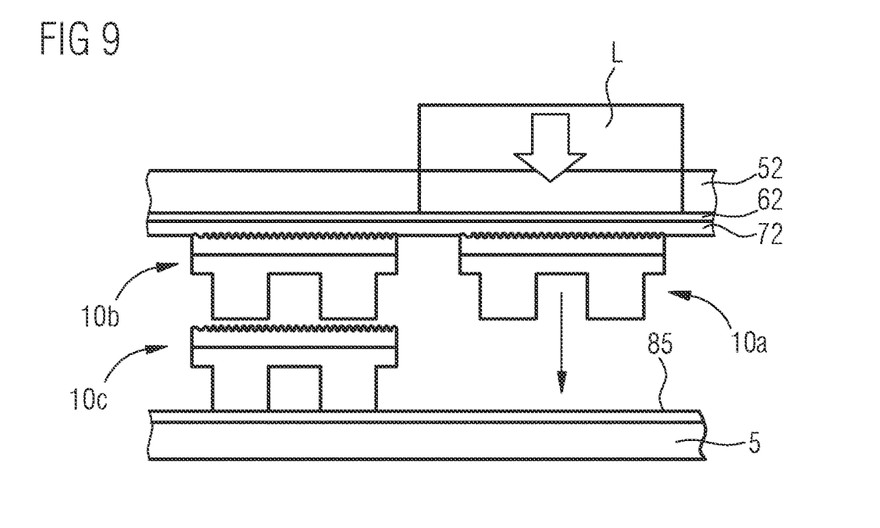
Figure 10:
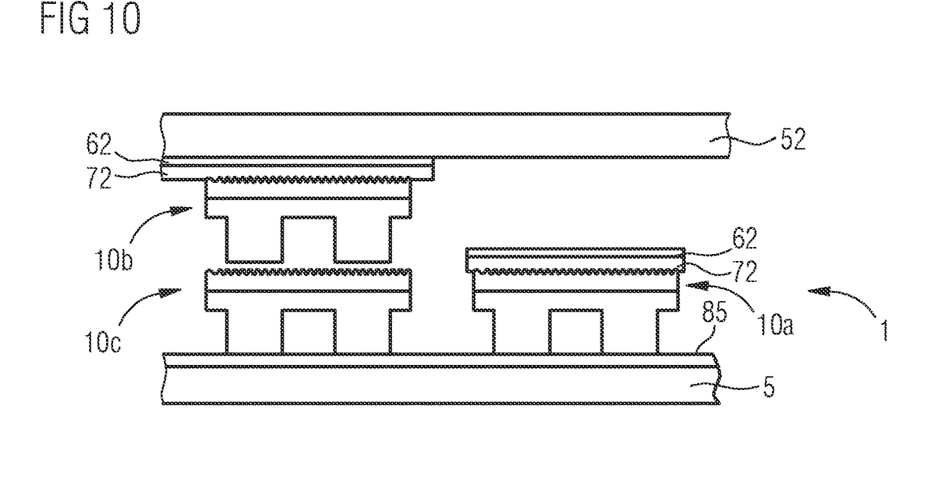

In the method step according to FIG. 9, a detachment of certain semiconductor chips 10*a* from the second auxiliary carrier 52 takes place. This detachment is in particular a selective single chip detachment process or a multichip detachment process onto a target substrate, i.e. onto the permanent carrier 5.

In particular, a so-called LIFT process can be used, which stands for Laser Induced Forward Transfer. For this purpose, by means of an excimer laser, for example, the laser radiation L is irradiated only at certain semiconductor chips 10*a*. These semiconductor chips 10*a* are brought onto the carrier 5 driven by gravity and/or driven by process gases generated during the decomposition of the respective detachment layer.

In particular, if prior testing and, for example, classification of the semiconductor chips 10 has been performed, only selected, suitably characterized semiconductor chips 10a can be selectively placed on the carrier 5 from the auxiliary carrier 52. Other semiconductor chips 10b may remain on the auxiliary carrier 52 and be placed on another carrier, not drawn.

It is possible that other semiconductor chips 10c are already on the carrier 5 when the semiconductor chip 10a is transferred. A distance between adjacent semiconductor chips 10a, 10b on the auxiliary carrier 52 may be different from a distance between the semiconductor chips 10a, 10c placed on the carrier 5 and is substantially freely adjustable.

For example, a solder layer 85 such as an adhesive solder is provided on the carrier 5. An optional structuring of the solder layer 85 is not drawn in FIG. 9 to simplify the illustration. If the solder layer 85 is structured, self-alignment can be performed when soldering the semiconductor chips 10a, 10c, since the semiconductor chips 10a, 10c can be pulled onto solder contact surfaces and straightened.

After arranging on the carrier 5, a final cleaning and/or stripping of residues of the layers 62, 72 is preferably carried out.

The detachment according to FIG. 9 is carried out, for example, by means of a polygon scanner, an electroplating mirror and/or with the aid of several laser spots. This allows defective and/or mismatched semiconductor chips 10a, 10b to remain on the auxiliary carrier 52.

FIGS. 11 to 14 show another exemplary embodiment of the manufacturing method. Here, the steps of FIGS. 11 to 14 preferably follow the step of FIG. 7 or also the step of FIG. 8 and in particular represent alternatives to the steps of FIGS. 9 and 10. In this respect, the comments on the preceding figures apply accordingly.

Figure 11:
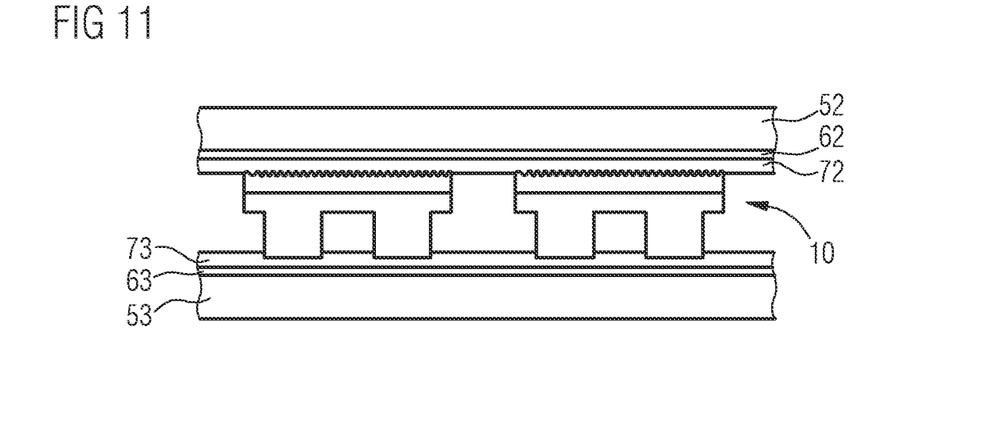
FIGS. 11 to 14 show schematic sectional views of method steps of an exemplary embodiment of a manufacturing method described herein.

In FIG. 11, it is illustrated that a third temporary, mechanically rigid auxiliary carrier 53 is attached, to which a third detachment layer 63 and a third bonding agent layer 73 are located. For components 53, 63, 73, the above explanations regarding components 51, 61, 71 and 52, 62, 72 apply accordingly.

Figure 12:
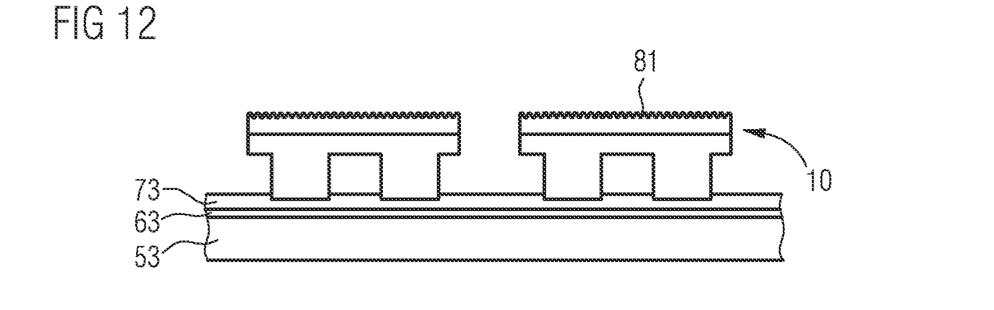

In FIG. 12 it is shown that the second auxiliary carrier 52 together with the components 62, 72 is removed. Thus the semiconductor bodies 3 with the optional roughening 81 are exposed.

Figure 13:
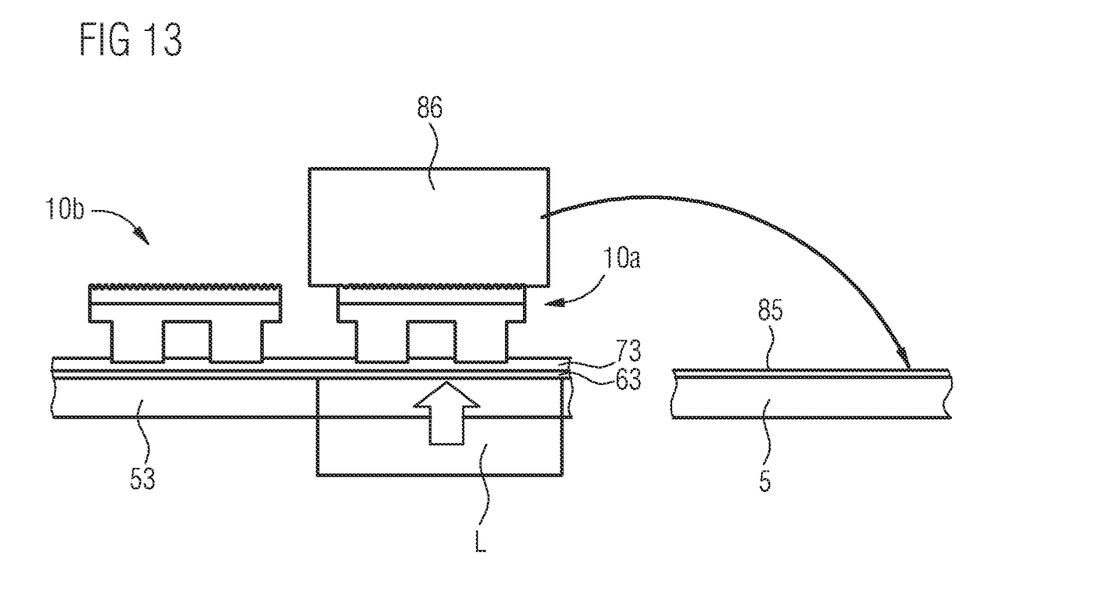

Detachment from the third auxiliary carrier 53 is again performed by means of laser radiation L by destroying the third detachment layer 63. Placement on the carrier 5 is performed, for example, by means of a transfer tool 86, which may be a stamp. Preferably, by means of the transfer tool 86, many of the semiconductor chips 10a can be transferred to the carrier 5 simultaneously.

Figure 14:
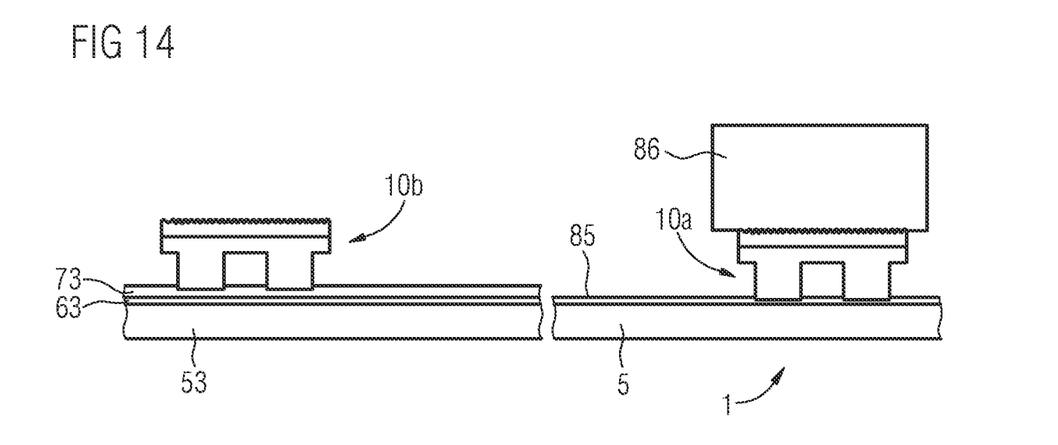

The resulting arranging on the carrier 5 is schematically illustrated in FIG. 14, wherein the transfer tool 86 is still drawn.

Figure 15:
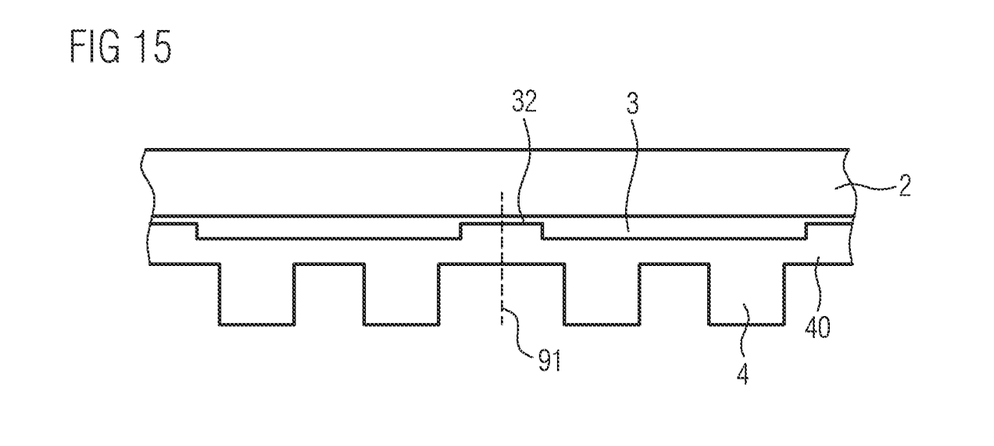
FIGS. 15 to 18 show schematic sectional views of method steps of an exemplary embodiment of a manufacturing method described herein.

For example, the method of FIGS. 11 to 14 can thus be summarized in particular as follows:

Front-end processing while the semiconductor bodies 3 are still on the growth substrate 2, wherein a continuous GaN separation layer 32 is present and the contact structures 4 or a backside metallization 40 are generated. Separation is carried out by photo-technique, see FIG. 1, or a continuous electroplating layer, for example of nickel, is used, see FIG. 15.

A connection is made to a first rigid auxiliary carrier 51 with a thin adhesive 71.

A laser lift-off process, also referred to as LLO for short, is performed using the GaN layer 32.

Optionally, KOH roughening of the semiconductor body 3 or other processing of the GaN side is performed.

A bonding to the rigid second auxiliary carrier 52 is performed using a thin adhesive 72.

A laser lift-off from the first auxiliary carrier 51 is performed, preferably over the entire surface, by means of the layer 61, which is preferably made of SiN or of ZnO.

The side formerly facing the growth substrate 2 is cleaned.

Optionally, a sample measurement and/or a light measurement takes place through the second auxiliary carrier 52, wherein a contacting can take place at the contact structures 4.

Optionally, a connection is made to a third auxiliary carrier 53 with a thin adhesive 73.

A full-surface laser lift-off of the second auxiliary carrier 52 takes place over the SiN layer or ZnO layer 62.

Cleaning of the side where the third auxiliary carrier 63 was located takes place.

Backend processes can be carried out, such as a chip transfer by means of stamps or by LIFT directly onto a target substrate 5 and/or an artificial wafer 5, wherein individual chips 10 or groups of chips 10 can be selectively detached and transferred in each case by means of a single-chip laser lift-off.

FIGS. 15 to 18 relate to method steps that can be carried out alternatively to the steps of FIGS. 1 to 4. According to FIG. 15, unlike in FIG. 1, the at least one metallization 40 extends substantially over the entire growth substrate 2, specifically over the regions of the singulation lanes 91.

Figure 16:
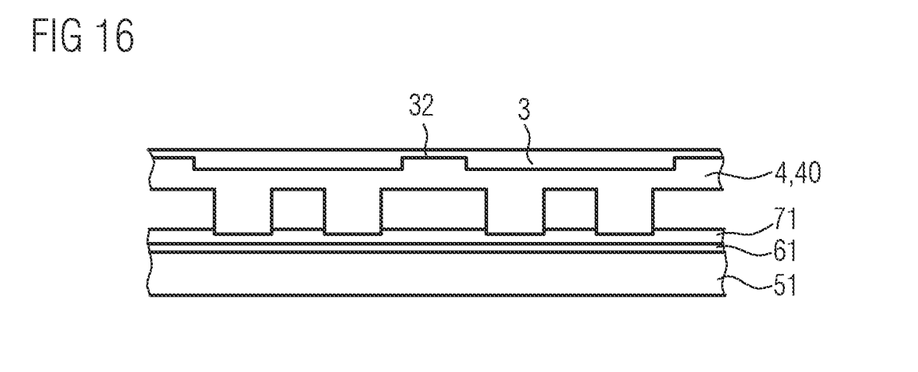

Subsequently, the first auxiliary carrier 51 is applied, see FIG. 16. Subsequently the detachment of the growth substrate is carried out. The growth substrate 2 is preferably detached analogously to the method step shown in FIG. 3.

Figure 17:
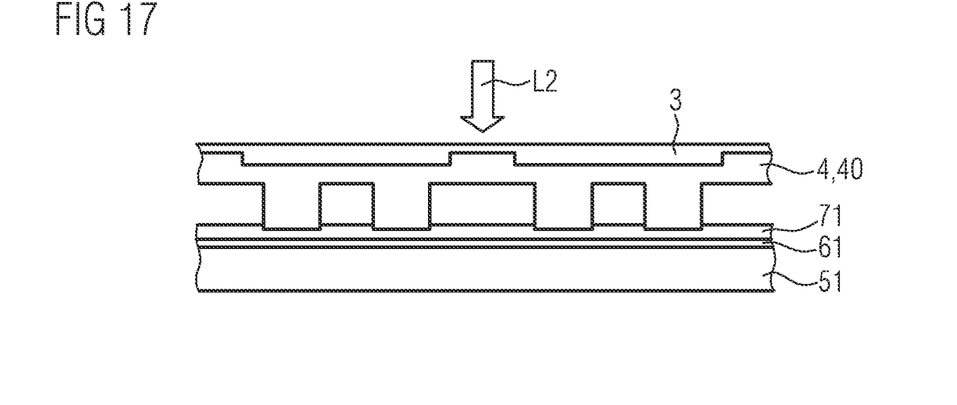

FIG. 17 illustrates a further method step. By means of a laser beam L2, preferably a picosecond laser beam or also a femtosecond laser beam, the metallization 40 is divided. This results in further singulation lanes 92 between the semiconductor bodies 3, so that the semiconductor chips 10 are formed. The further singulation lanes 92 comprise, for example, a width of at most 5 µm or 2 µm and can thus be narrower than the first singulation lanes 91 illustrated in FIG. 1.

For subdividing into the semiconductor chips 10 during the separation of the metallization 40, protective layers which are not drawn may optionally be present, which in particular cover otherwise exposed areas of the semiconductor bodies 3 or also the entire artificial wafer.

Figure 18:
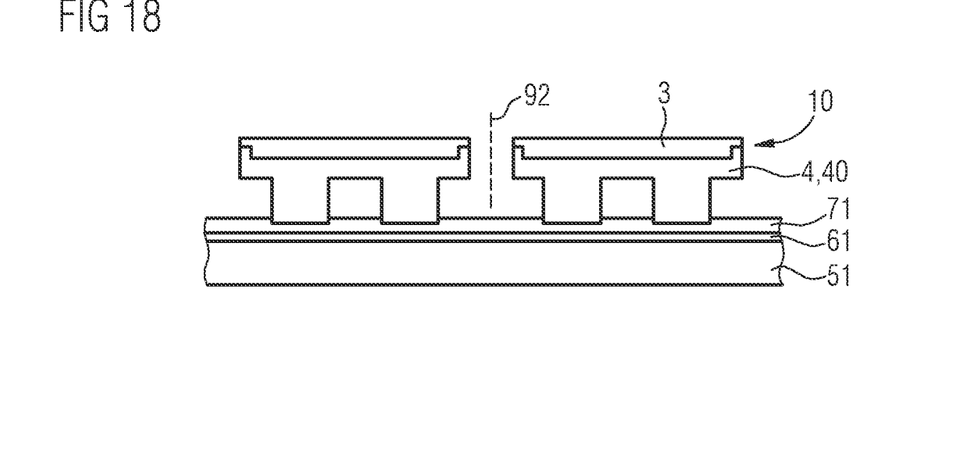

The method steps following FIG. 18 can be carried out according to FIGS. 5 to 10 or also according to FIGS. 11 to 14.

Figure 19:
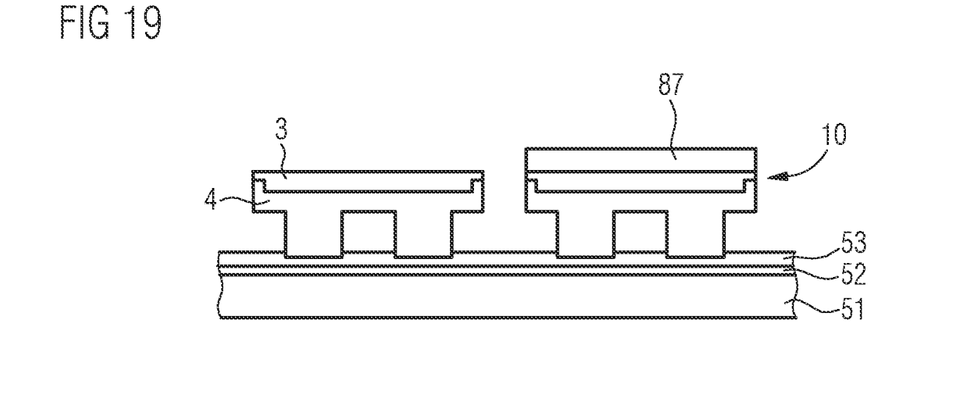
FIG. 19 shows a schematic sectional view of a method step of an exemplary embodiment of a manufacturing method described herein.

FIG. 19 illustrates an optional method step which can be carried out in the methods according to FIGS. 15 to 18 and in methods according to FIGS. 1 to 10 or as well as FIGS. 11 to 14. In this method, a phosphor 87 is arranged on the semiconductor bodies 3. The arrangement of the phosphor 87 is, for example, a printing or also a laminating. Deviating from the illustration of FIG. 19, the phosphor 87 can also be applied at another method step.

Figure 20:
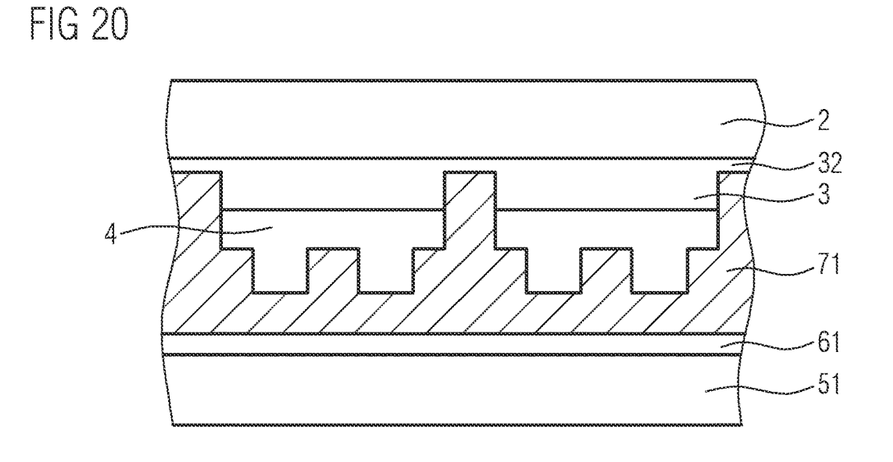
FIG. 20 shows a schematic sectional view of a method step of an exemplary embodiment of a manufacturing method described herein.

FIG. 20 illustrates that, for example, the first bonding agent 71 can be applied not only as a thin layer, but that the first bonding agent 71 can completely or almost completely embed the semiconductor chips 3 and optionally the contact structures 4. The same can apply to the other bonding agents 72, 73.

Figure 21:
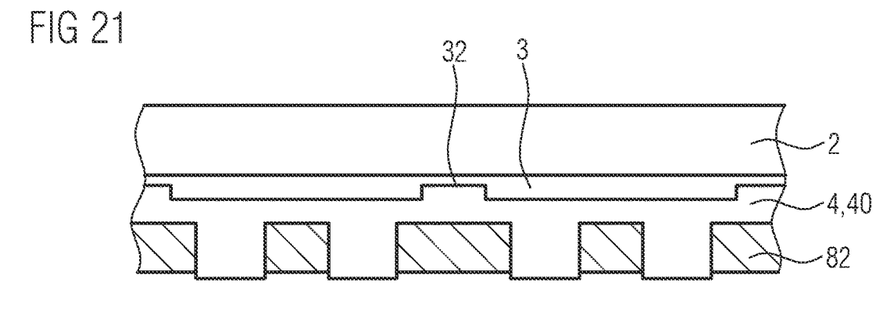
FIG. 21 shows a schematic sectional view of a method step of an exemplary embodiment of a manufacturing method described herein.

In FIG. 21 it is illustrated that a filler material 82 is additionally applied. The filler material 82 is, for example, a plastic. The contact structures 4 may be embedded in the filler material 82 so that the filler material 82 is molded directly onto the contact structures 4. With the application of the filler material 82 or also with a subsequent planarization, which is not shown, the filler material 82 as well as the contact structures 4 can be flush with each other in the direction away from the semiconductor bodies 3.

The filler material 82 can be cut together with the metallization 40 in a method step analogous to FIG. 17. As in the method of FIGS. 15 to 18, such a filler material 82 can also be used in the method according to FIGS. 1 to 10 and correspondingly according to FIGS. 11 to 14.

Figure 22:
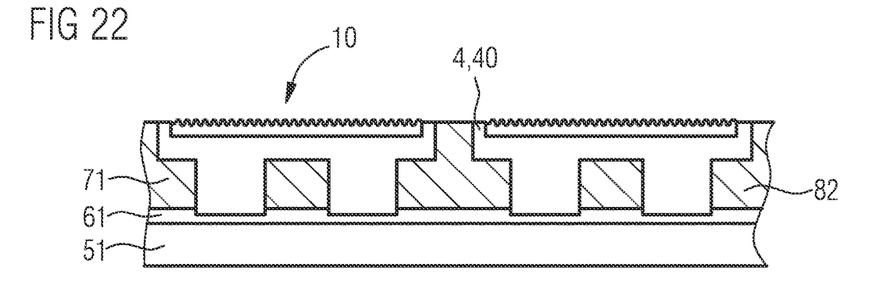
FIG. 22 shows a schematic sectional view of a method step of an exemplary embodiment of a manufacturing method described herein.

Deviating from FIG. 21, it is illustrated in FIG. 22 that the filler material 82 can also be applied when the semiconductor chips 10 are located on one of the auxiliary carriers 51, 52, 53. The filler material 82 need not be generated when the first auxiliary carrier 51 is present, but may alternatively be generated only at the second auxiliary carrier 52 or at the third auxiliary carrier 53.

Figure 23:
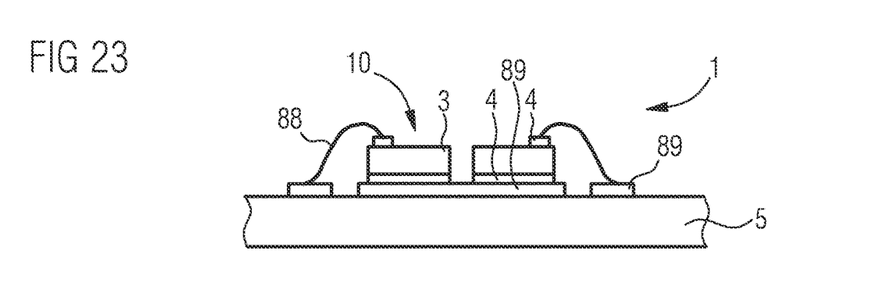
FIG. 23 shows a schematic sectional view of an exemplary embodiment of an optoelectronic semiconductor device described herein.

FIG. 23 illustrates an alternative contacting of the semiconductor chips 10, which can correspondingly also be used in all other exemplary embodiments. The semiconductor chips 10 are not flip chips, but semiconductor chips with electrical contact pads on opposite main sides. Contacting towards contacting surfaces 89 on the carrier 5 is carried out, for example, by means of bonding wires 88.

Unless otherwise indicated, the components shown in the figures preferably follow each other directly in the sequence indicated. Layers not touching in the figures are preferably spaced apart. Insofar as lines are drawn parallel to each other, the corresponding surfaces are preferably also aligned parallel to each other. Likewise, unless otherwise indicated, the relative positions of the drawn components to each other are correctly reproduced in the figures.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

The invention claimed is:

1. A method for producing optoelectronic semiconductor devices, the method comprising:
   providing a growth substrate with a plurality of semiconductor bodies for the semiconductor devices, wherein each semiconductor body comprises electrical contact structures and a separation layer arranged towards the growth substrate;
   arranging a rigid first auxiliary carrier on a side of the semiconductor bodies facing away from the growth substrate, wherein the first auxiliary carrier comprises a first detachment layer;
   detaching the growth substrate by first laser radiation, wherein the first laser radiation is absorbed in the separation layer, and wherein contact structures assigned to different semiconductor bodies are electrically separated from each other on the rigid first auxiliary carrier when the growth substrate is detached;
   arranging a rigid second auxiliary carrier on a side of the semiconductor bodies facing away from the first auxiliary carrier, wherein the second auxiliary carrier comprises a second detachment layer;
   detaching the first auxiliary carrier by second laser radiation, wherein the second laser radiation is absorbed in the first detachment layer; and
   mechanically and electrically arranging the semiconductor bodies on at least one permanent carrier,
   wherein the method is performed in the recited order.

2. The method according to claim 1, wherein the semiconductor bodies comprise an average edge length of between 10 µm and 140 µm inclusive when viewed in a plan view of the growth substrate, and wherein the semiconductor bodies detached from the growth substrate together with associated electrical contact structures are flip chips so that all electrical contact structures for external electrical contacting are attached to a side of the semiconductor bodies facing away from the growth substrate.

3. The method according to claim 1,
   wherein a semiconductor layer sequence for the semiconductor bodies is removed during structuring of the semiconductor bodies up to the separation layer, wherein an active zone of the semiconductor layer sequence is interrupted,
   wherein the separation layer is still partially present in the finished semiconductor devices,
   wherein the separation layer is an undoped GaN layer and parts of the semiconductor layer sequence adjacent to the separation layer are made of doped GaN or of doped InGaN, and
   wherein the separation layer laterally protrudes beyond the semiconductor bodies in the finished semiconductor devices.

4. The method according to claim 1,
   wherein the first auxiliary carrier is attached to the semiconductor bodies by a first bonding agent layer and the second auxiliary carrier is attached to the semiconductor bodies by a second bonding agent layer,
   wherein the first and second bonding agent layers are different from the first and second detachment layers, respectively,
   wherein the first bonding agent layer is completely removed after removal of the first auxiliary carrier, and
   wherein the first bonding agent layer is not affected by the second laser radiation for removing the first auxiliary carrier.

5. The method according to claim 1, wherein, when the growth substrate is detached, a metallization for the contact structures extends over all semiconductor bodies and bridges regions between the semiconductor bodies.

6. The method according to the claim 5, wherein the metallization in the bridge regions between the semiconductor bodies is divided in a separate separation after removal detachment of the growth substrate.

7. The method according to claim 1, wherein the semiconductor bodies are light-emitting diodes and, after the first auxiliary carrier has been detached, a roughening is produced on the semiconductor bodies in order to improve a light extraction.

8. The method according to claim 1,
   wherein the second auxiliary carrier is detached by third laser third radiation and the third laser radiation is absorbed in the second detachment layer, and
   wherein the semiconductor bodies are transferred directly from the second auxiliary carrier to the permanent carrier.

9. The method according to claim 1, further comprising, after detaching the first auxiliary carrier, attaching a rigid third auxiliary carrier so that the third auxiliary carrier is located at the contact structures, wherein subsequently the second auxiliary carrier is detached by third laser radiation and the third laser radiation is absorbed in the second detachment layer.

10. The method according to claim 9, wherein by fourth laser radiation and/or by a stamping process a plurality of the semiconductor bodies are transferred from the third auxiliary carrier to the permanent carrier.

11. The method according to claim 1,
wherein the contact structures are embedded in a filler material before arranging the semiconductor bodies to the permanent carrier, and
wherein the filler material is cut in regions between the semiconductor bodies after detaching the growth substrate.

12. The method according to claim 1, wherein the first laser radiation for detaching the semiconductor bodies from the growth substrate and the second laser radiation for detaching at least one of the auxiliary carriers is scanned over the growth substrate and over the at least one of the auxiliary carriers so that only individual semiconductor bodies are detached from the growth substrate and from the at least one of the auxiliary carriers.

13. The method according to claim 12,
wherein the semiconductor bodies grown on the growth substrate are distributed on several different permanent carriers,
wherein a plurality of the semiconductor bodies are arranged on each permanent carrier, and
wherein an average distance between adjacent semiconductor bodies on the each carrier is at most 0.2 mm.

14. The method according to claim 1, further comprising, after detaching the first auxiliary carrier and before attaching the semiconductor bodies to the at least one permanent carrier, testing the semiconductor bodies and/or material-removing the contact structures.

15. The method according to claim 1,
wherein the growth substrate is sapphire,
wherein the semiconductor bodies are based on AlInGaN,
wherein the separation layer and the detachment layers are each of silicon nitride, gallium nitride, and/or zinc oxide,
wherein the auxiliary carriers are made of sapphire, quartz glass or glass,
wherein the laser radiation is passed through each auxiliary carrier for releasing this auxiliary carrier, and
wherein the contact structures are composed of a plurality of metals.

16. The method according to claim 1, wherein the first laser radiation for detaching the semiconductor bodies from the growth substrate is scanned over the growth substrate and so that only individual semiconductor bodies are detached from the growth substrate.

17. The method according to claim 1, wherein the second laser radiation for detaching at least one of the auxiliary carriers is scanned over the at least one of the auxiliary carriers so that only individual semiconductor bodies are detached from the at least one of the auxiliary carriers.

18. The method according to claim 1, wherein the separation layer still extends continuously over the growth substrate when detaching.

19. A method for producing optoelectronic semiconductor devices, the method comprising:
providing a growth substrate with a plurality of semiconductor bodies for the semiconductor devices, wherein each semiconductor body comprises electrical contact structures and a separation layer arranged towards the growth substrate;
arranging a rigid first auxiliary carrier on a side of the semiconductor bodies facing away from the growth substrate, wherein the first auxiliary carrier comprises a first detachment layer;
detaching the growth substrate by first laser radiation, wherein the first laser radiation is absorbed in the separation layer;
arranging a rigid second auxiliary carrier on a side of the semiconductor bodies facing away from the first auxiliary carrier, wherein the second auxiliary carrier comprises a second detachment layer;
detaching the first auxiliary carrier by second laser radiation, wherein the second laser radiation is absorbed in the first detachment layer and the separation layer still extending continuously over the growth substrate while detaching; and
mechanically and electrically arranging the semiconductor bodies on at least one permanent carrier,
wherein the method is performed in the recited order, and
wherein the first laser radiation for detaching the semiconductor bodies from the growth substrate and/or the second laser radiation for detaching at least one of the auxiliary carriers is scanned over the growth substrate and/or over the at least one of the auxiliary carriers so that only individual semiconductor bodies are detached from the growth substrate and/or from the at least one of the auxiliary carriers.

20. A method for producing optoelectronic semiconductor devices, the method comprising:
providing a growth substrate with a plurality of semiconductor bodies for the semiconductor devices, wherein each semiconductor body comprises electrical contact structures and a separation layer arranged towards the growth substrate;
arranging a rigid first auxiliary carrier on a side of the semiconductor bodies facing away from the growth substrate, wherein the first auxiliary carrier comprises a first detachment layer;
detaching the growth substrate by laser first radiation, wherein the first laser radiation is absorbed in the separation layer;
arranging a rigid second auxiliary carrier on a side of the semiconductor bodies facing away from the first auxiliary carrier, wherein the second auxiliary carrier comprises a second detachment layer;
detaching the first auxiliary carrier by second laser radiation, wherein the second laser radiation is absorbed in the first detachment layer and the separation layer still extending continuously over the growth substrate while detaching; and
mechanically and electrically arranging the semiconductor bodies on at least one permanent carrier,
wherein the method is performed in the recited order,
wherein, after detaching the first auxiliary carrier, a rigid third auxiliary carrier is attached so that the third auxiliary carrier is located at the contact structures, and
wherein subsequently the second auxiliary carrier is detached by third laser radiation and the third laser radiation is absorbed in the second detachment layer.

* * * * *

UNITED STATES PATENT AND TRADEMARK OFFICE
CERTIFICATE OF CORRECTION

| | | |
|---|---|---|
| PATENT NO. | : 12,112,968 B2 | Page 1 of 1 |
| APPLICATION NO. | : 17/288430 | |
| DATED | : October 8, 2024 | |
| INVENTOR(S) | : Ralph Wagner | |

It is certified that error appears in the above-identified patent and that said Letters Patent is hereby corrected as shown below:

In the Claims

In Column 14, Line 45, Claim 6:
Change "The method according to the claim 5"
To --The method according to claim 5--

In Column 14, Line 47, Claim 6:
Change "after removal detachment of the growth substrate"
To --after removal of the detachment of the growth substrate--

In Column 14, Line 56, Claim 8:
Change "third laser third radiation and the third laser radiation"
To --third laser radiation and the third laser radiation--

Signed and Sealed this
Seventeenth Day of December, 2024

Derrick Brent
*Acting Director of the United States Patent and Trademark Office*